(12) United States Patent
Tao et al.

(10) Patent No.: US 7,709,392 B2
(45) Date of Patent: May 4, 2010

(54) LOW K DIELECTRIC SURFACE DAMAGE CONTROL

(75) Inventors: Hun-Jan Tao, HsinChu (TW); Ryan Chia-Jen Chen, Chiayi (TW); Mong-Song Liang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 855 days.

(21) Appl. No.: 11/457,888

(22) Filed: Jul. 17, 2006

(65) Prior Publication Data
US 2007/0026668 A1    Feb. 1, 2007

Related U.S. Application Data

(63) Continuation-in-part of application No. 10/701,825, filed on Nov. 5, 2003, now abandoned.

(51) Int. Cl.
*H01L 21/302* (2006.01)
(52) U.S. Cl. ............... 438/706; 438/724; 257/E21.252
(58) Field of Classification Search .......... 438/706, 438/724, 638; 257/E21.252
See application file for complete search history.

(56) References Cited

U.S. PATENT DOCUMENTS

| 6,524,950 B1 | 2/2003 | Lin |
| 6,579,791 B1 | 6/2003 | Tu et al. |
| 6,616,855 B1 | 9/2003 | Chen et al. |
| 2005/0095869 A1* | 5/2005 | Tao et al. ............ 438/724 |

OTHER PUBLICATIONS

Dr. Dan Tracy, "The Emerging Copper Revolution Will Impact ICs With Critical Dimensions Smaller Than 100 nm", ChipScale, Mar. 2001, 4 pages.

* cited by examiner

*Primary Examiner*—Jack Chen
(74) *Attorney, Agent, or Firm*—Duane Morris LLP

(57) ABSTRACT

A method of removing a silicon nitride or a nitride-based bottom etch stop layer in a copper damascene structure by etching the bottom etch stop layer is disclosed, with the method using a high density, high radical concentration plasma containing fluorine and oxygen and further optionally $N_2$ and any one of inert gases, to minimize back sputtering of copper underlying the bottom etch stop layer and surface roughening of the low-k interlayer dielectric caused by the plasma.

12 Claims, 1 Drawing Sheet

LOW K DIELECTRIC SURFACE DAMAGE CONTROL

CROSS REFERENCE TO RELATED APPLICATION

This application is a continuation-in-part of application Ser. No. 10/701,825, filed Nov. 5, 2003 now abandoned.

FIELD OF THE INVENTION

The present invention relates to a method of forming a copper damascene structure in a semiconductor device, and more particularly to a method of removing a silicon nitride or a nitride-based bottom etch stop layer in a copper damascene structure having a porous low K interlayer dielectric.

BACKGROUND OF THE INVENTION

In the conventional process for forming copper damascene structures in semiconductor devices, after the damascene opening has been etched into the porous low-k interlayer dielectric (ILD), the bottom etch stop layer is etched with a dry etch process before the damascene opening is filled with copper metal. A number of materials may be used for the bottom etch stop layer. Silicon carbide and silicon nitride are examples of materials commonly used for this purpose. Where the bottom etch stop layer is silicon nitride, the dry etch process conventionally practiced is plasma etch with a bias power. However, this etch process is generally conducted with a very low bias power because any "overetch" of the silicon nitride layer will cause undesirable back sputtering of the underlying copper in to the via. Such back sputtering of the underlying copper is not desirable because the sputtered extraneous copper deposits on the sidewalls of the low-k ILD can cause reliability problems.

Thus, an improved method of etching the silicon nitride bottom etch stop layer in a copper damascene structure is desired. The concerns discussed herein are equally applicable to single damascene structures, copper via step structures, and copper dual damascene structures (with or without an intermediate etch stop layer).

SUMMARY OF THE INVENTION

According to an embodiment of the present invention, disclosed herein is a method of removing a nitride-based bottom etch stop layer in a copper damascene structure, by etching the bottom etch stop layer using a high density, high radical concentration plasma containing fluorine and oxygen. The copper damascene structure may be a via step, a single damascene structure, a dual damascene structure, or a non-intermediate etch stop layer dual damascene structure.

DETAILED DESCRIPTION OF THE INVENTION

According to an embodiment of the present invention, disclosed herein is an etch process for removing a nitride-based bottom etch stop layer in a copper damascene structure. The method according to the present invention is applicable to a variety of copper damascene structures, such as, for example, a single damascene, a dual damascene, a non-intermediate etch stop layer dual damascene, and a via step structure.

Figure 1:
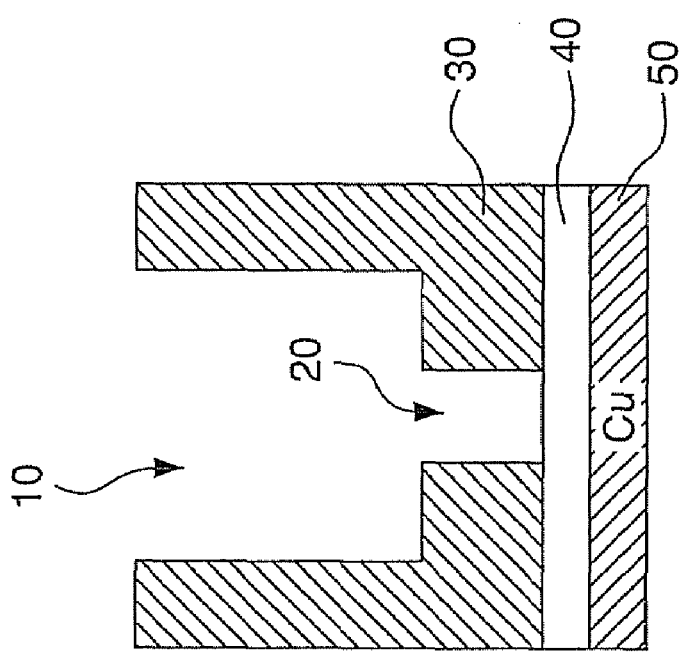
FIG. 1 is a sectional illustration of a non-intermediate etch stop layer dual damascene structure at an interim process step before the removal of the bottom etch stop layer.

FIG. 1 illustrates a typical non-intermediate etch stop layer dual damascene structure at an interim stage of processing where a trench 10 and a via 20 openings have been formed in low-k interlayer dielectric (ILD) 30 but bottom etch stop layer 40 is still intact. Various other materials may be used for bottom etch stop layers, but the method of the present invention is applicable to those copper damascene structures utilizing a nitride-based bottom etch stop layer. The bottom etch stop layer 40 may be composed of silicon nitride or other nitride-based materials such as oxynitride, a mixture of silicon oxide and silicon.

According to an embodiment of the present invention, the bottom etch stop layer 40 at the bottom of the via 20 is etched using a high density, high radical concentration plasma containing fluorine and oxygen. The high radical concentration in the plasma is defined as having a radical-to-ion ratio equal to or greater than about 10:1. By "radical-to-ion-ratio," it is meant the ratio of (1) the combination of fluorine and oxygen radicals to (2) the combination of fluorine and oxygen ions.

Thus, a method of etching a nitride-based bottom etch stop layer in a copper damascene structure is also disclosed, with the method comprising: etching the nitride-based bottom etch stop layer using a high density, high radical concentration plasma containing both fluorine and oxygen, wherein the fluorine and oxygen radical to fluorine and oxygen ion ratio in the plasma is equal to or greater than about 10:1.

By keeping the amount of ion in the plasma low, back sputtering of the copper underneath the bottom etch stop layer is minimized, while also minimizing the physical damage to the surface of the low-k ILD by the plasma. If the radical-to-ion ratio is less than about 10:1, there is a greater likelihood that the underlying copper 50 will back sputter and deposit on the low-k ILD sidewalls of the damascene via 20, which may cause reliability issues. Also, plasma containing a higher ion content has a tendency to cause physical damage on the exposed horizontal surface 35 of the low-k ILD in the dual damascene structure during the etch process, producing a rough low-k ILD surface. The rough surface is not desirable because it will increase the copper layer's sheet resistance, Rs, in the final copper damascene structure, especially in narrow lines.

In a preferred embodiment of the present invention, high density plasma may be produced utilizing one of a variety of available methods, such as, for example, inductive coupling plasma, electron cyclotron resonance, helicon wave, surface wave, and some capacitive coupling plasma, and microwave plasma tool. The use of a high density plasma source is to have high dissociation so as to create more free fluorine or oxygen radical. A high radical concentration is helpful for controlling the bottom etch stop layer's edge profile around the etched area. When the bottom etch stop layer 40 is removed from the bottom of the via 20 using the high radical-to-ion ratio plasma containing fluorine and oxygen, the edge profile of the bottom etch stop layer around the opening is vertical rather than tapered. The fluorine in the plasma may be provided by at least one of $CF_4$, $CHF_3$, $SF_6$, $NF_3$, $C_2F_6$, $C_4F_8$, $CH_2F_2$, $CH_3F$, and $C_4F_6$. High radical concentration also increases the etching process throughput.

Figure 2:
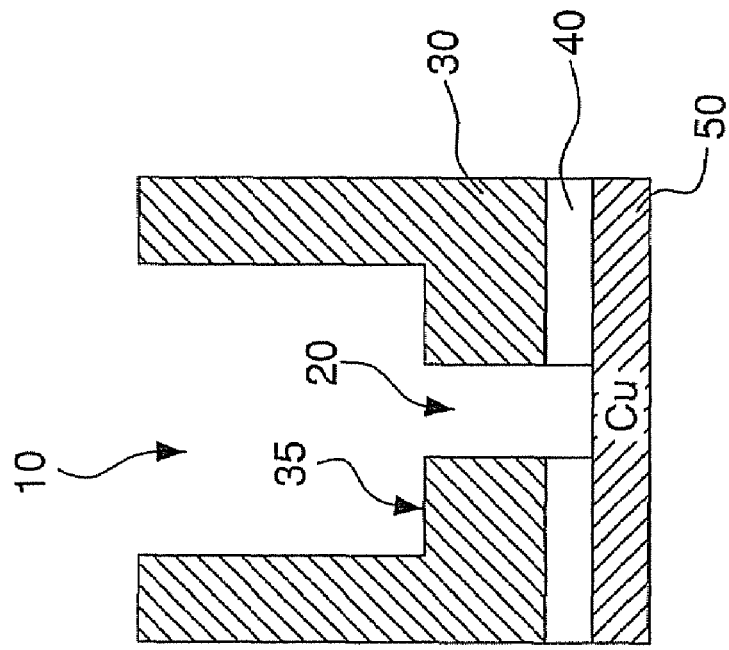
FIG. 2 is a sectional illustration of the non-intermediate etch stop layer dual damascene structure of FIG. 1, after the bottom etch stop layer has been removed.

By using a high density, high radical-to-ion ratio plasma containing fluorine and oxygen, a more chemical and less physical plasma etching is achieved, thus effectively removing the nitride-based bottom etch stop layer, while minimizing the back sputter of the underlying copper and the surface damage of the low-k ILD in the damascene opening formed by the trench 10 and via 20. FIG. 2 illustrates the non-intermediate etch stop layer dual damascene structure of FIG. 1 just after the bottom etch stop layer 40 has been etched away, using the process according to an embodiment of the present invention from the bottom of the via 20.

While the foregoing invention has been described with reference to the above embodiments, various modifications and changes can be made without departing from the spirit of the invention. Accordingly, all such modifications and changes are considered to be within the scope of the appended claims.

What is claimed is:

1. A method of etching a nitride-based bottom etch stop layer in a copper damascene structure comprising: etching the nitride-based bottom etch stop layer using a high density, high radical concentration plasma containing both fluorine and oxygen, wherein the ratio of (a) the combination of fluorine and oxygen radicals to (b) the combination of fluorine and oxygen ions in the plasma is equal to or greater than about 10:1.

2. A method according to claim 1, wherein the nitride-based bottom etch stop layer is silicon nitride.

3. A method according to claim 1, wherein the nitride-based bottom etch stop layer is oxynitride.

4. A method according to claim 1, wherein the fluorine is provided by at least one of $CF_4$, $CHF_3$, $SF_6$, $NF_3$, $C_2F_6$, $C_4F_8$, $CH_2F_2$, $CH_3F$, and $C_4F_6$.

5. A method according to claim 1, wherein the high density, high radical concentration plasma further comprises $N_2$ and any one of inert gases.

6. A method according to claim 1, wherein the copper damascene structure is a non-intermediate etch stop layer dual damascene.

7. A method of etching a nitride-based bottom etch stop layer in a copper damascene structure comprising: etching the nitride-based bottom etch stop layer using a high density, high radical concentration plasma containing both fluorine and oxygen, wherein the radical-to-ion ratio of (a) the combination of fluorine and oxygen radicals to (b) the combination of fluorine and oxygen ions in the plasma is equal to or greater than about 10:1.

8. A method according to claim 7, wherein the nitride-based bottom etch stop layer is silicon nitride.

9. A method according to claim 7, wherein the nitride-based bottom etch stop layer is oxynitride.

10. A method according to claim 7, wherein the fluorine is provided by at least one of $CF_4$, $CHF_3$, $SF_6$, $NF_3$, $C_2F_6$, $C_4F_8$, $CH_2F_2$, $CH_3F$, and $C_4F_6$.

11. A method according to claim 7, wherein the high density, high radical concentration plasma further comprises $N_2$ and any one of inert gases.

12. A method according to claim 7, wherein the copper damascene structure is a non-intermediate etch stop layer dual damascene.

* * * * *